(12) United States Patent
Huang et al.

(10) Patent No.: US 8,647,986 B2
(45) Date of Patent: Feb. 11, 2014

(54) SEMICONDUCTOR PROCESS

(75) Inventors: Po-Cheng Huang, Chiayi (TW); Teng-Chun Tsai, Tainan (TW); Chia-Lin Hsu, Tainan (TW); Chun-Wei Hsu, Taipei (TW); Yen-Ming Chen, New Taipei (TW); Chih-Hsun Lin, Ping-Tung County (TW); Chang-Hung Kung, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 338 days.

(21) Appl. No.: 13/220,692

(22) Filed: Aug. 30, 2011

(65) Prior Publication Data

US 2013/0052825 A1 Feb. 28, 2013

(51) Int. Cl.
- *H01L 21/306* (2006.01)
- *H01L 21/321* (2006.01)
- *H01L 21/3105* (2006.01)
- *H01L 21/768* (2006.01)

(52) U.S. Cl.
CPC ......... *H01L 21/3212* (2013.01); *H01L 21/3105* (2013.01); *H01L 21/31051* (2013.01); *H01L 21/31053* (2013.01); *H01L 21/7684* (2013.01)
USPC .............. 438/692; 257/E21.304; 257/E21.23; 257/E21.409; 257/E21.243; 257/E21.244; 257/E21.245

(58) Field of Classification Search
CPC ..................... H01L 21/3212; H01L 21/31051; H01L 21/31053; H01L 21/3105; H01L 21/37684
USPC ..................... 438/692; 257/E21.304, E21.23, 257/E21.409, E21.243, E21.244, E21.245, 257/E21.246

See application file for complete search history.

(56) References Cited

U.S. PATENT DOCUMENTS

| | | | |
|---|---|---|---|
| 7,144,816 B2 | 12/2006 | Barns | |
| 7,166,506 B2 * | 1/2007 | Prince | |
| 7,709,380 B2 * | 5/2010 | Veloso | 438/664 |
| 8,003,458 B2 * | 8/2011 | Huebinger et al. | 438/221 |
| 2004/0253775 A1 * | 12/2004 | Achuthan et al. | 438/197 |
| 2007/0148886 A1 * | 6/2007 | Veloso | 438/300 |
| 2007/0241386 A1 * | 10/2007 | Wang et al. | 257/314 |
| 2010/0048007 A1 * | 2/2010 | Lee et al. | 438/585 |
| 2010/0151640 A1 * | 6/2010 | Huebinger et al. | 438/221 |
| 2013/0095644 A1 * | 4/2013 | Tu et al. | 438/585 |

* cited by examiner

*Primary Examiner* — Lan Vinh
*Assistant Examiner* — David Kaufman
(74) *Attorney, Agent, or Firm* — Winston Hsu; Scott Margo

(57) ABSTRACT

A semiconductor process includes the following steps. A first gate structure and a second gate structure are formed on a substrate, wherein the top of the first gate structure includes a cap layer, so that the vertical height of the first gate structure is higher than the vertical height of the second gate structure. An interdielectric layer is formed on the substrate. A first chemical mechanical polishing process is performed to expose the top surface of the cap layer. A second chemical mechanical polishing process is performed to expose the top surface of the second gate structure or an etching process is performed to remove the interdielectric layer located on the second gate structure. A second chemical mechanical polishing process is then performed to remove the cap layer.

20 Claims, 5 Drawing Sheets

SEMICONDUCTOR PROCESS

BACKGROUND OF THE INVENTION

1. Field of the Invention

The present invention relates generally to a semiconductor process, and more specifically, to a semiconductor process that polishes a plurality of gate structures of different vertical heights at the same time by changing the polishing selectivity of a chemical mechanical polishing process or by adding an etching process.

2. Description of the Prior Art

In modern CMOS integrated circuits, progress in production techniques has enabled the size of components to be scaled down to deep-submicron sizes for both improving the performance of the integrated circuits and increasing the operating speed. Some problems, however, particularly involving reliability, will occur with the decrease in size of components. Other processes should therefore be integrated in the semiconductor processes in order to solve these problems.

For example, in order to reduce the sheet resistance of the source/drain region and the gate of CMOS components, a self-aligned silicide (Salicide) process is provided. The self-aligned silicide (Salicide) process is performed by covering a metal layer on a substrate and gates after the gates and the source/drain regions alongside the gates are formed. The metal layer is then heated to transform it to a silicide, and the unreacted metal layer is removed.

Because the salicide is selectively disposed on a needed portion of the substrate and the gates, a salicide block (self-aligned silicide block or SAB) is formed in the areas not covered by salicide to prevent salicide coverage occurring before the metal layer is covered. When there are two gate structures, one gate structure needs to be covered by salicide while the other one does not, so a salicide block will cover the gate structure that does not need to be covered by salicide. After the process is performed, the two gate structures will have different thicknesses, so the interdielectric layer material that covers the thinner gate structure will remain even after a polishing process is performed. On the other hand, if the interdielectric layer material is entirely removed, the thicker gate structure will be over-etched or over-polished; this results in the vertical height of the gate structure being hard to be controlled, which affects the inner structure of the gate structure and thereby reduces the electrical performance.

SUMMARY OF THE INVENTION

The present invention provides a semiconductor process, which can solve the problem of interdielectric layer materials remaining on a gate structure due to the height difference in two gate structures that leads to bad electrical performance of the gate structure.

The present invention provides a semiconductor process that comprises the following steps. A first gate structure and a second gate structure are formed on a substrate, wherein the top of the first gate structure includes a cap layer, so that the vertical height of the first gate structure is higher than the vertical height of the second gate structure. An interdielectric layer is formed on the substrate and covers the first gate structure and the second gate structure. A first chemical mechanical polishing process is performed to polish the interdielectric layer until the top surface of the cap layer is exposed. A second chemical mechanical polishing process is performed to at least polish the first gate structure and the interdielectric layer until the top surface of the second gate structure is exposed.

The present invention provides a semiconductor process including the following steps. A first gate structure and a second gate structure are formed on a substrate, wherein the top of the first gate structure includes a cap layer, so that the vertical height of the first gate structure is higher than the vertical height of the second gate structure. An interdielectric layer is formed on the substrate and covers the first gate structure and the second gate structure. A first chemical mechanical polishing process is performed to polish the interdielectric layer until the top surface of the cap layer is exposed. An etching process is performed to remove the interdielectric layer located on the second gate structure. A second chemical mechanical polishing process is performed to at least polish the first gate structure and the interdielectric layer until the cap layer is removed.

The present invention provides a semiconductor process, which performs a chemical mechanical polishing process or an etching process that can make the first gate structure and the second gate structure be exposed evenly without having the prior art problems of over-etching or over-polishing of the gate structure, wherein the chemical mechanical polishing process has an approximate polishing selectivity of the cap layer and the interdielectric layer, and the etching process removes the remaining interdielectric layer on the gate structure of a lower vertical height.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
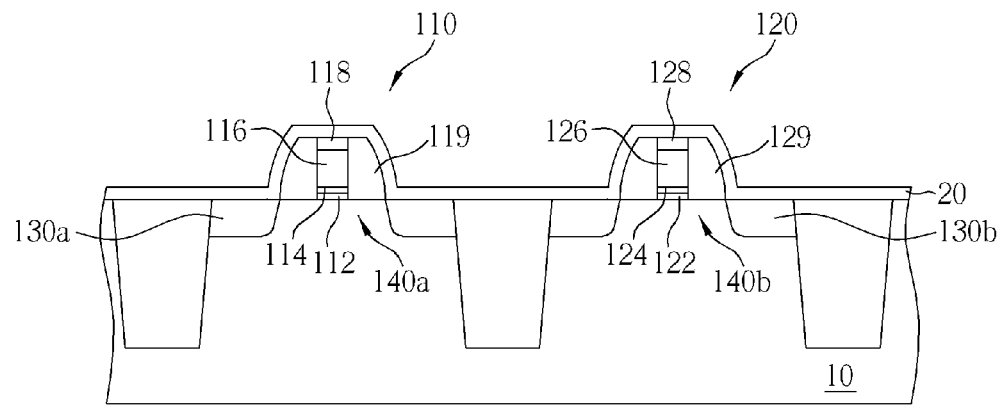
FIGS. 1-8 schematically depict a cross-sectional view of a semiconductor process according to one preferred embodiment of the present invention.

FIGS. 1-8 schematically depict a cross-sectional view of a semiconductor process according to one preferred embodiment of the present invention. As shown in FIG. 1, after a first gate structure 110, a second gate structure 120 and two corresponding source/drain regions 130a and 130b are formed, a stress memorization technique (SMT) can be selectively performed to respectively force stress to the gate channel 140a and 140b beneath the first gate structure 110 and the second gate structure 120; thereby the carrier mobility of the gate channel 140a and 140b is improved. The stress memorization technique (SMT) may include forming a strained silicon material (not shown) in the source/drain region 130a and 130b such as forming a silicon germanium layer in a PMOS transistor or forming a silicon carbide layer in an NMOS transistor, or covering a corresponding stress layer (not shown) on the first gate structure 110 and the second gate structure 120, but the techniques are not limited thereto. In detail, the first gate structure 110 and the second gate structure 120 may respectively include a buffer layer 112 and 122 located on the substrate 10, a gate dielectric layer 114 and 124 located on the buffer layer 112 and 122, a gate layer 116 and 126 located on the gate dielectric layer 114 and 124, a cap layer 118 and 128 located on the gate layer 116 and 126 and a spacer 119 and 129 located beside the buffer layer 112 and 122, the gate dielectric layer 114 and 124, the gate layer 116 and 126 and the cap layer 118 and 128. The materials and the forming methods of the gate structure are known in the art and therefore not described herein.

Please refer to FIG. 1 again. A salicide block 20 covers the substrate 10, the first gate structure 110 and the second gate structure 120. The salicide block 20 may be a silicon nitride layer. The salicide block 20 may further include an oxide layer (not shown) located between the substrate 10 and the nitride layer for buffering.

Figure 2:
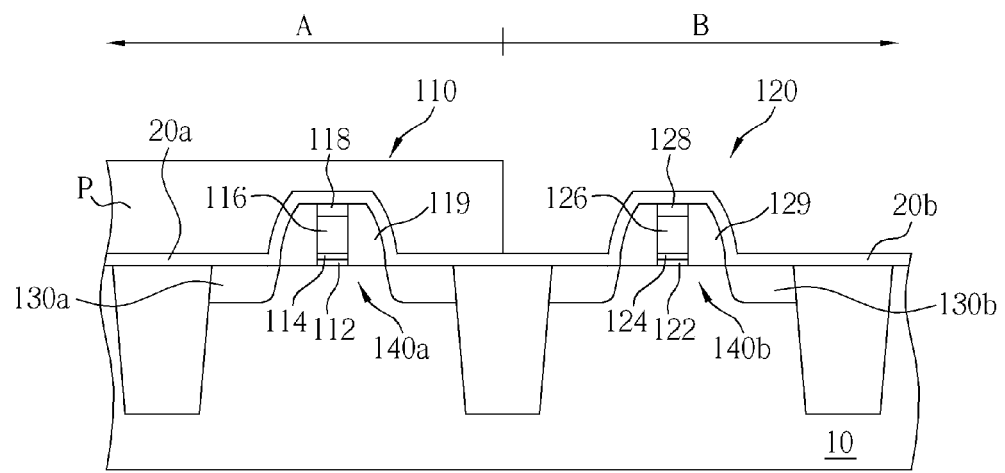
Figure 3:
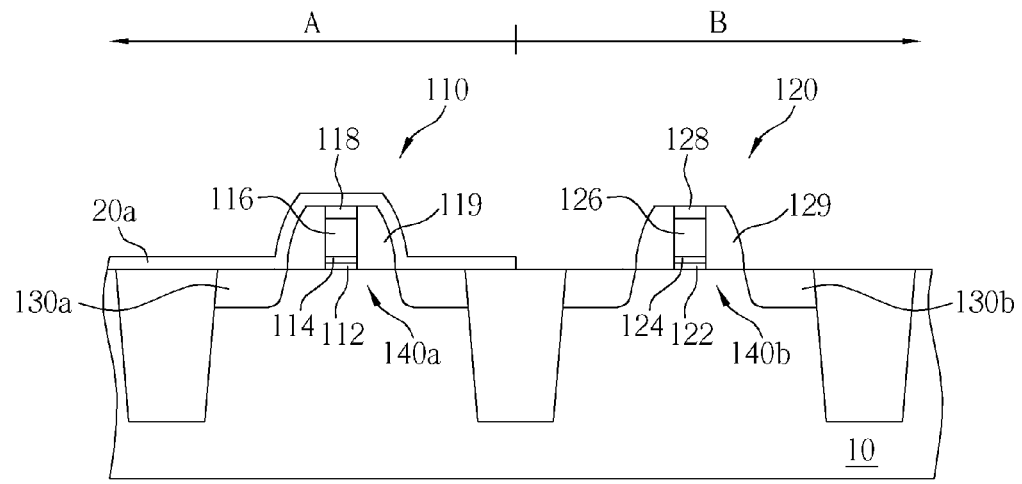

As shown in FIG. 2-3, the salicide block 20 is defined in the area A, which does not need salicide formed thereon. As shown in FIG. 2, a patterned photoresist P is formed, which covers the salicide block 20a located in the area A and exposes the salicide block 20b located in the area B, which needs salicide formed thereon. As shown in FIG. 3, an etching process is performed to remove the salicide block 20b. The photoresist P is removed so that the patterned salicide block 20a remains.

Figure 4:
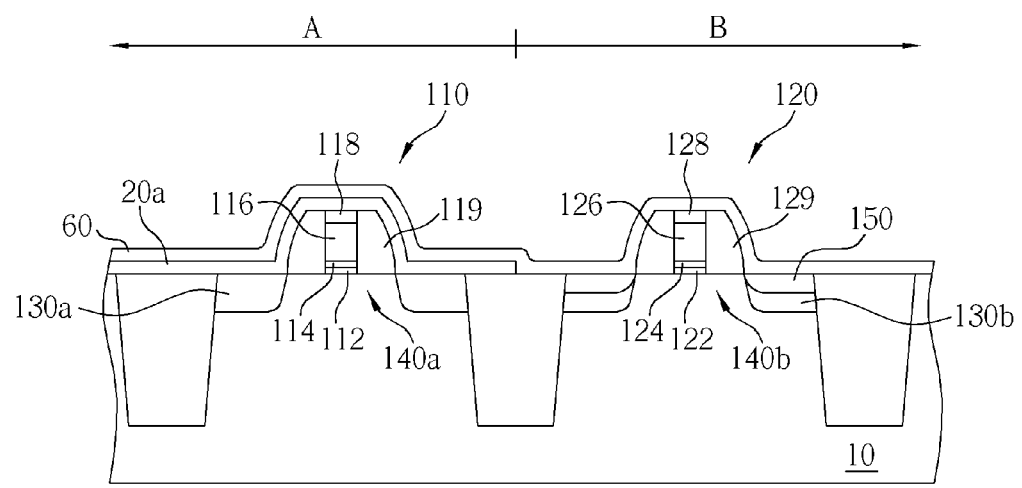

As shown in FIG. 4, a metal layer 60 is entirely deposited on the substrate 10, so that it covers the salicide block 20a in the area A and covers the second gate structure 120 and the source/drain region 130b in the area B. A rapid thermal anneal (RTA) process is performed to form a salicide by reacting the metal layer 60 with the (silicon) substrate, meaning a salicide 150 is respectively formed on the source/drain region 130b. Then, the unreacted metal layer 60 is removed. The materials of the metal layer 60 may include nickel, cobalt, titanium, etc. and these materials can react with the (silicon) substrate to transform it to nickel-silicon compounds, titanium silicon compounds, etc. After the metal layer 60 is removed, another rapid thermal anneal (RTA) process may be selectively performed to reduce the resistance of the salicide 150.

Figure 5:
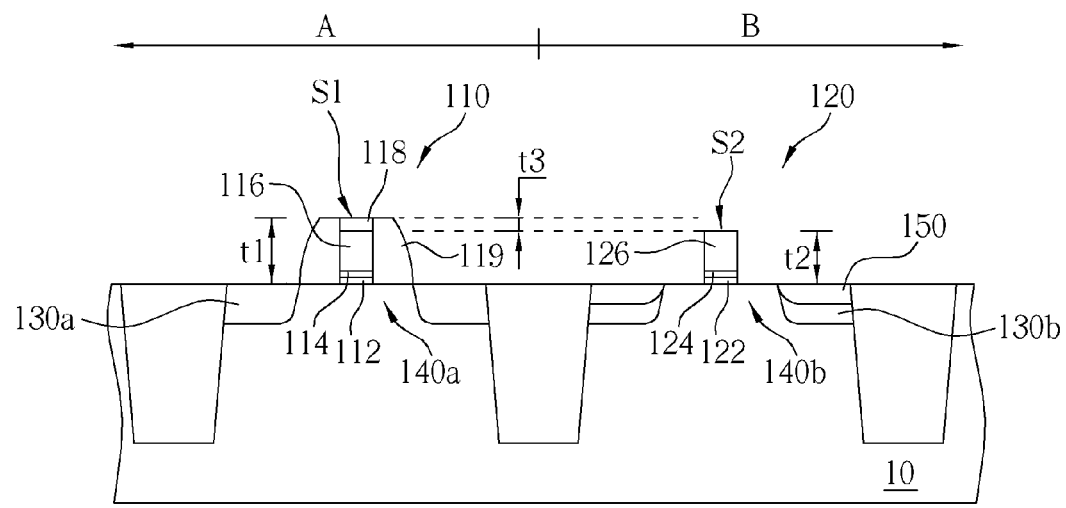

As shown in FIG. 5, after the salicide 150 is formed, the salicide block 20a is removed. Due to the salicide block 20a usually being a nitride layer, the cap layer 128 and the spacer 129 in the second gate structure 120, which are also composed of nitride, will be removed as the salicide block 20a is removed. It is worth noting that the cap layer 128 and the spacer 129 in the second gate structure 120 are already removed at this point so the vertical height of the first gate structure 110 on the substrate 10 is higher than the vertical height of the second gate structure 120 on the substrate 10. That is, the thickness t1 of the first gate structure 110 is greater than the thickness t2 of the second gate structure 120 because the first gate structure 110 has a cap layer 118 but the second gate structure 120 does not. Therefore, the level of the top surface S1 of the first gate structure 110 is a greater thickness t3 (in the order of hundreds of angstroms) than the level of the top surface S2 of the second gate structure 120. In this embodiment, the first gate structure 110 and the second gate structure 120 of different heights are formed via the aforesaid method, but in another embodiment, the first gate structure 110 and the second gate structure 120 of different heights may be formed in a different way. The numbers of the gate structures of different heights are not restricted to be two.

Figure 6:
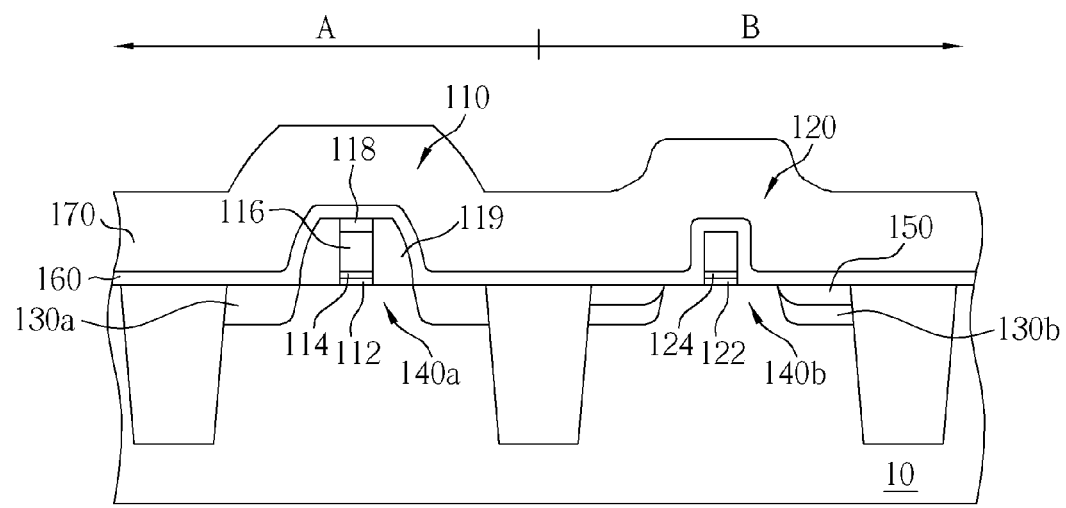

As shown in FIG. 6, a contact etching stop layer (CESL) 160 may selectively cover the substrate 10, the first gate structure 110 and the second gate structure 120, wherein the contact etching stop layer (CESL) 160 may be a nitride layer, and it may be doped with impurities to make it have the capability of a stress layer, which can force the gate channel 140a and 140b below. An interdielectric layer 170 is formed on the substrate 10 and covers the first gate structure 110 and the second gate structure 120. In this embodiment, the interdielectric layer 170 is an oxide layer, but it is not limited thereto.

Figure 7:
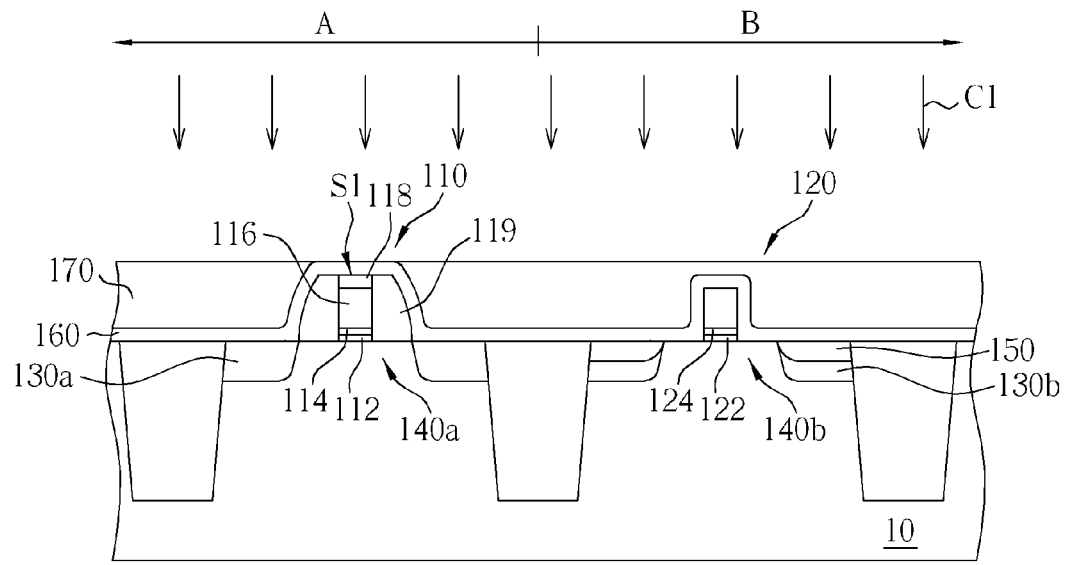

As shown in FIG. 7, a first chemical mechanical polishing process C1 is performed to polish the interdielectric layer 170 until the contact etching stop layer 160 in the area A is exposed. In one case, if the contact etching stop layer 160 is not covered, the top surface S1 of the cap layer 118 will be exposed. As shown in FIG. 7, due to the first gate structure 110 and the second gate structure 120 having different heights (more precisely, due to the top of the first gate structure 110 further including the cap layer 118), a portion of the interdielectric layer 170 will remain on the second gate structure 120 after the first chemical mechanical polishing process C1 is performed.

Figure 8:
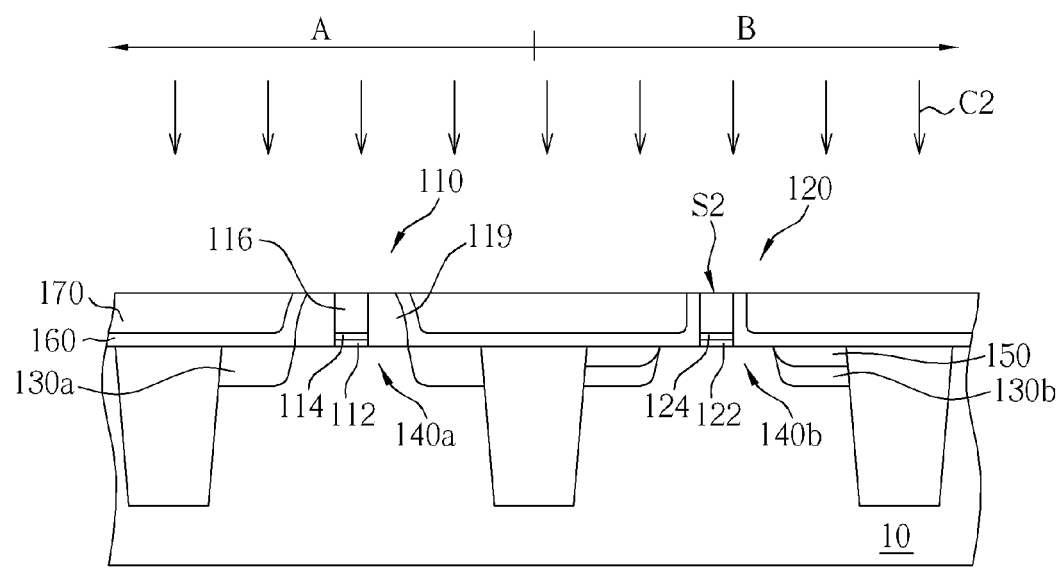

As shown in FIG. 8, a second chemical mechanical polishing process C2 is performed to at least polish the first gate structure 110 and the interdielectric layer 170 and expose the top surface S2 of the second gate structure 120. As shown in FIG. 7, due to a portion of the interdielectric layer 170 remaining on the second gate structure 120, and the cap layer 118 and the interdielectric layer 170 being of different materials, a second chemical mechanical polishing process C2 is applied in this invention, wherein the slurry of the second chemical mechanical polishing process C2 has a nitride/oxide polishing selectivity between the range of 0.8~1.2 when polishing the cap layer 118 and the interdielectric layer 170. Preferably, the nitride/oxide polishing selectivity is 1. Therefore, the cap layer 118 and the interdielectric layer 170 can be removed uniformly without the problems of the prior art caused by the cap layer 118 being removed too fast, leading to the over-polishing of the first gate structure 110. In a preferred embodiment, the second chemical mechanical polishing process C2 includes a chemical mechanical polishing process with equal polishing selectivity, meaning the polishing slurry has the same polishing rate for oxidation and nitridation, therefore the polishing rate of the cap layer 118 is equal to the polishing rate of the interdielectric layer 170. In this embodiment, the cap layer 118 is a nitride layer, and the interdielectric layer 170 is an oxide layer, so the polishing slurry of the second chemical mechanical polishing process may include an oxygen inhibitor. The concentration of the oxygen inhibitor in this embodiment is less than the concentration of the oxygen inhibitor of the prior art, so the polishing rate of the interdielectric layer 170 relative to the cap layer 118 can be faster, and the cap layer 128 and the interdielectric layer 170 can therefore be removed uniformly until the gate layer 116 and 126 of the first gate structure 110 and the second gate structure 120 are exposed.

Due to the second chemical mechanical polishing process C2 having the same polishing rate for oxidation and nitridation, the second chemical mechanical polishing process C2 will first remove the contact etching stop layer 160 located on the first gate structure 110 in the area A and the interdielectric layer 170 in the area B, and then, as the contact etching stop layer 160 is polished until the top surface S2 of the second gate structure 120 is exposed by the second chemical mechanical polishing process C2, the cap layer 118 in the area A will be removed entirely because the portion of the first gate structure 110 which is higher than the second gate structure 120 is the cap layer 118. At this time, the contact etching stop layer 160 located on the second gate structure 120 is also removed as the cap layer 118 is removed. After the cap layer 118 is removed entirely, the gate layer 116 and 126 in the first gate structure 110 and the second gate structure 120 are both exposed. In another embodiment, the height and relative positions of the internal structures of the first gate structure and the second gate structure may be different, and this depends upon processing needs and methods. The present invention is not restricted to the first gate structure 110 and the second gate structure 120 illustrated in this embodiment.

Figure 9:
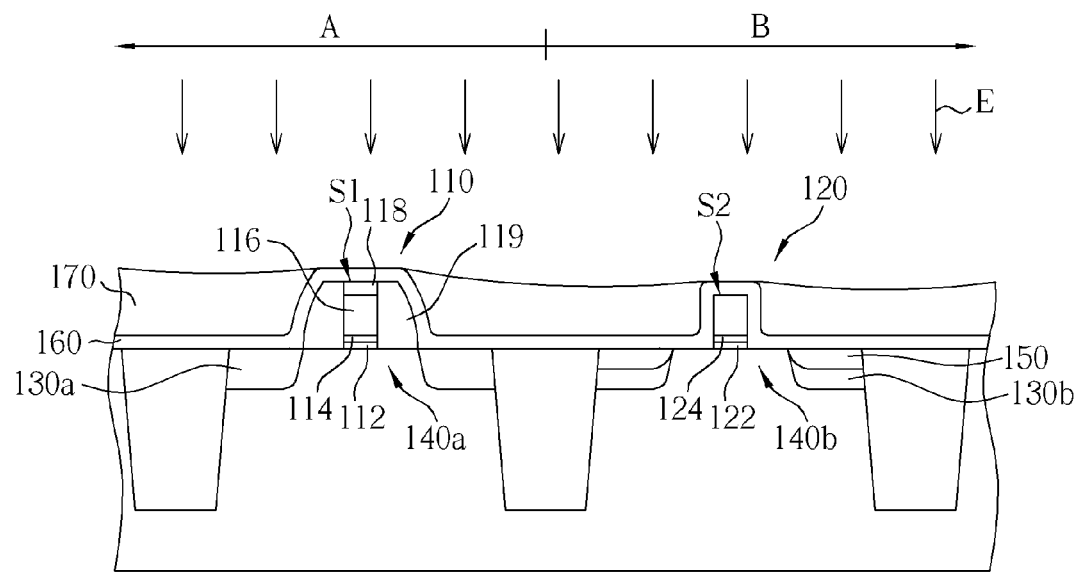
FIGS. 9-10 schematically depict a cross-sectional view of a semiconductor process according to one preferred embodiment of the present invention.
Figure 10:
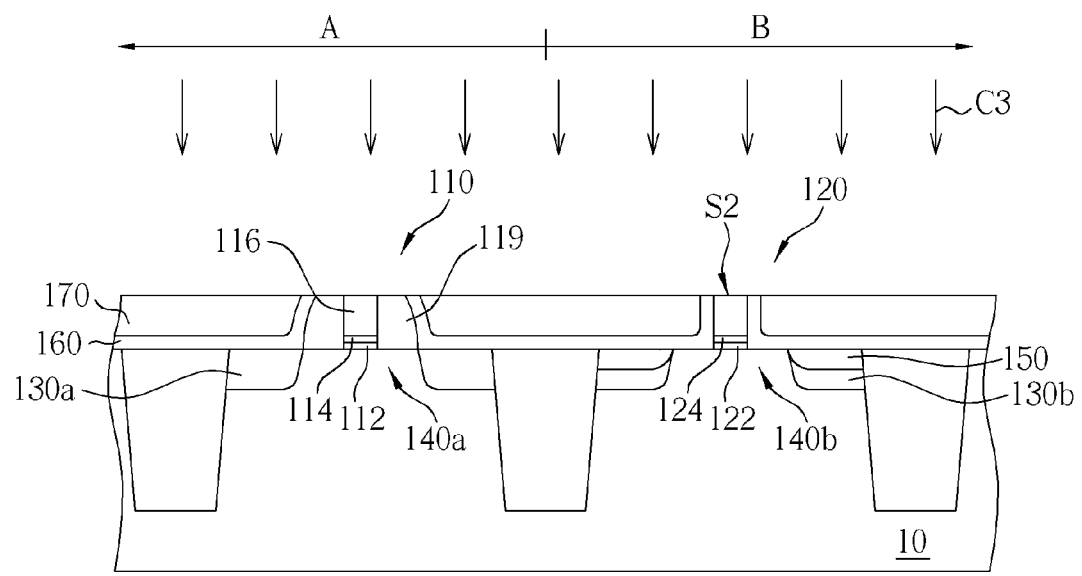

The present invention also provides an alternative method for achieving similar objectives. FIGS. 9-10 schematically depict a cross-sectional view of a semiconductor process according to one preferred embodiment of the present invention. As shown in FIGS. 1-7, the first gate structure 110 and the second gate structure 120 are formed on the substrate 10, wherein the top of the first gate structure 110 includes a cap layer 118, so that the vertical height (commonly called the thickness t1 in this embodiment) of the first gate structure 110 is higher than the vertical height (commonly called the thickness t2 in this embodiment) of the second gate structure 120. An interdielectric layer 170 is formed on the substrate 10 and covers the first gate structure 110 and the second gate structure 120. A first chemical mechanical polishing process C1 is performed to polish the interdielectric layer 170 until the top surface S1 of the cap layer 118 is exposed. The forming methods of these steps are already described in the last embodiment, and are therefore not described in detail here.

As shown in FIG. 9, an etching process E is performed to remove the interdielectric layer 170 on the second gate structure 120. The etching process E may include a dry etching process or a wet etching process, and the wet etching process may include an etching process with hydrofluoric acid-containing etchant, but it is not limited thereto. In this embodiment, the cap layer 118 is a nitride layer and the interdielectric layer 170 is an oxide layer, so the etching process E may include an oxide etching process. In a preferred embodiment, the etchant of the etching process E only etches the interdielectric layer 170, so the cap layer 118 of the first gate structure 110 will not be damaged. (If the contact etching stop layer 160 covers the first gate structure 110, the contact etching stop layer 160 will not be damaged.) That is, the etching process E of the present invention only removes the interdielectric layer 170 to expose the first gate structure 110 and the second gate structure 120, or to expose the contact etching stop layer 160.

As shown in FIG. 10, a second chemical mechanical polishing process C3 is performed to at least polish the first gate structure 110 and the interdielectric layer 170 until the cap layer 118 is removed. If the contact etching stop layer 160 is further formed, the contact etching stop layer 160 on the top surface S1 of the first gate structure 110 and the top surface S2 of the second gate structure 120 can also be removed. In one embodiment, due to the etching process E already removing the interdielectric layer 170 on the second gate structure 120, the polishing rate of the second chemical mechanical polishing process C3 used on the cap layer 118 is preferably higher than that used on the interdielectric layer 170. This means that the interdielectric layer 170 between the first gate structure 110 and the second gate structure 120 will not be depressed due to over-polishing.

In this embodiment, if the contact etching stop layer 160 covers the first gate structure 110, the second gate structure 120 and the substrate 10, the second chemical mechanical polishing process C3 will remove the contact etching stop layer 160 located on the first gate structure 110. When the contact etching stop layer 160 is polished to expose the top surface S2 of the second gate structure 120 by the second chemical mechanical polishing process C3, the cap layer 118 will be removed entirely because the portion of the first gate structure 110 that is higher than second gate structure 120 is the cap layer 118. At this time, as the cap layer 118 is removed, the contact etching stop layer 160 located on the second gate structure 120 is also removed. After the cap layer 118 is removed entirely, the gate layer 116 and 126 in the first gate structure 110 and the second gate structure 120 are both exposed. In another embodiment, the height and relative positions of the internal structures of the first gate structure and the second gate structure may be different, and this depends upon processing needs and methods. The present invention is not restricted to the first gate structure 110 and the second gate structure 120 illustrated in this embodiment.

After the gate layer 116 and 126 are exposed, other semiconductor processes may be performed in this invention, such as a metal gate process.

Above all, the present invention provides a semiconductor process, which performs a chemical mechanical polishing process or an etching process that can ensure the first gate structure and second gate structure are exposed evenly (more specifically, the gate layer of the first gate structure and second gate structure can be exposed evenly) without having the prior art problems of over-etching or over-polishing of the gate structure, wherein the chemical mechanical polishing process has an approximate polishing selectivity re the cap layer and the interdielectric layer, and the etching process removes the remaining interdielectric layer of the gate structure with a lower vertical height. Therefore, the semiconductor process of the present invention can improve the electrical performance of the gate structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a first gate structure and a second gate structure on a substrate, wherein a top of the first gate structure comprises a cap layer, so that a vertical height of the first gate structure is higher than a vertical height of the second gate structure;
    forming an interdielectric layer on the substrate and covering the first gate structure and the second gate structure;
    performing a first chemical mechanical polishing process to polish the interdielectric layer until a top surface of the cap layer is exposed; and
    performing a second chemical mechanical polishing process to at least polish a portion of the first gate structure and the interdielectric layer to expose a top surface of the second gate structure.

2. The semiconductor process according to claim 1, wherein the cap layer and the interdielectric layer comprise different materials.

3. The semiconductor process according to claim 2, wherein the cap layer comprises a nitride layer and the interdielectric layer comprises an oxide layer.

4. The semiconductor process according to claim 3, wherein the polishing slurry of the second chemical mechanical polishing process comprises an oxygen inhibitor.

5. The semiconductor process according to claim 1, wherein the polishing selectivity of the second chemical mechanical polishing process to the cap layer and the interdielectric layer is between the range of 0.8~1.2.

6. The semiconductor process according to claim 5, wherein the second chemical mechanical polishing process comprises a chemical mechanical polishing process with an equal polishing selectivity, meaning the polishing rate of the cap layer and the interdielectric layer is substantially the same.

7. The semiconductor process according to claim 1, wherein when the second chemical mechanical polishing process exposes the top surface of the second gate structure, the cap layer is also entirely removed.

8. The semiconductor process according to claim 1, wherein the second chemical mechanical polishing process exposes a gate layer in the first gate structure and the second gate structure.

9. The semiconductor process according to claim 1, further comprising: forming a contact etching stop layer covering the first gate structure, the second gate structure and the substrate.

10. The semiconductor process according to claim 8, wherein the second chemical mechanical polishing process removes the cap layer and a portion of the contact etching stop layer.

11. A semiconductor process, comprising:
   forming a first gate structure and a second gate structure on a substrate, wherein a top of the first gate structure comprises a cap layer, so that a vertical height of the first gate structure is higher than a vertical height of the second gate structure;
   forming an interdielectric layer on the substrate and covering the first gate structure and the second gate structure;
   performing a first chemical mechanical polishing process to polish the interdielectric layer until a top surface of the cap layer is exposed;
   performing an etching process to remove the interdielectric layer located on the second gate structure; and
   performing a second chemical mechanical polishing process to at least polish a portion of the first gate structure and the interdielectric layer until the cap layer is removed.

12. The semiconductor process according to claim 11, wherein the cap layer and the interdielectric layer comprise different materials.

13. The semiconductor process according to claim 12, wherein the cap layer comprises a nitride layer and the interdielectric layer comprises an oxide layer.

14. The semiconductor process according to claim 13, wherein the etching process comprises an oxygen etching process.

15. The semiconductor process according to claim 11, wherein the etchant of the etching process only etches the interdielectric layer.

16. The semiconductor process according to claim 11, wherein the etching process comprises a dry etching process or a wet etching process.

17. The semiconductor process according to claim 16, wherein the wet etching process comprises an etching process utilizing hydrofluoric acid-containing etchant.

18. The semiconductor process according to claim 11, wherein the second chemical mechanical polishing process has a higher polishing rate of the cap layer than of the interdielectric layer.

19. The semiconductor process according to claim 11, further comprising:
   forming a contact etching stop layer covering the first gate structure, the second gate structure and the substrate, wherein the cap layer and a portion of the contact etching stop layer are removed while the second chemical mechanical polishing process is performed.

20. The semiconductor process according to claim 11, wherein the second chemical mechanical polishing process exposes a gate layer in the first gate structure and the second gate structure.

* * * * *